United States Patent [19]
Abrahamson et al.

[11] Patent Number: 5,984,293
[45] Date of Patent: Nov. 16, 1999

[54] APPARATUS FOR HOLDING PRINTED CIRCUIT BOARD ASSEMBLIES IN MANUFACTURING PROCESSES

[75] Inventors: Steve Abrahamson, Boise; Curtis C. Thompson, Sr., Meridian, both of Id.

[73] Assignee: MCMS, Inc., Nampa, Id.

[21] Appl. No.: 08/882,479

[22] Filed: Jun. 25, 1997

[51] Int. Cl.⁶ ..................................................... B25B 1/24
[52] U.S. Cl. ........................... 269/266; 269/267; 269/53; 269/236
[58] Field of Search ................................ 269/266, 21, 70, 269/74, 66, 236, 231, 53

[56] References Cited

U.S. PATENT DOCUMENTS

| | | | |
|---|---|---|---|
| 1,453,176 | 4/1923 | Perrine | 269/266 |
| 2,754,708 | 7/1956 | Peterson | 269/266 |
| 2,882,771 | 4/1959 | Blazek | 269/266 |
| 4,088,312 | 5/1978 | Frosch et al. | |
| 4,200,272 | 4/1980 | Godding | 269/266 |
| 4,206,910 | 6/1980 | Biesemeyer | 269/236 |
| 4,572,564 | 2/1986 | Cipolla | 269/266 |
| 4,684,113 | 8/1987 | Douglas et al. | |
| 4,770,455 | 9/1988 | Collins, Jr. | 269/267 |
| 4,838,531 | 6/1989 | Corsi | |
| 4,936,560 | 6/1990 | Barozzi | |
| 5,120,033 | 6/1992 | Shoda | |
| 5,218,753 | 6/1993 | Suzuki et al. | |
| 5,364,083 | 11/1994 | Ross et al. | 269/21 |
| 5,722,646 | 3/1998 | Soderberg et al. | 269/266 |
| 5,738,345 | 4/1998 | Schroeder et al. | |

*Primary Examiner*—David A. Scherbel
*Assistant Examiner*—Lee Wilson
*Attorney, Agent, or Firm*—Seed and Berry, LLP

[57] ABSTRACT

A universal fixture for holding printed circuit board assemblies during stencil printing, pick-and-place processing, and other PCB assembly processes. In one embodiment, a universal printed circuit board holder has a base and a plurality of support members movably attached to the base. The support members may project away from the base along support paths, and the support members are selectively positionable along the support paths when the support members engage a side of a printed circuit board assembly. Accordingly, the support members may be selectively positioned at heights corresponding to a topography of the side of the printed circuit board assembly to uniformly support the printed circuit board assembly.

41 Claims, 4 Drawing Sheets

APPARATUS FOR HOLDING PRINTED CIRCUIT BOARD ASSEMBLIES IN MANUFACTURING PROCESSES

TECHNICAL FIELD

The present invention relates to processing printed circuit board assemblies, and more specifically to supporting a side of a printed circuit board assembly populated with components.

BACKGROUND OF THE INVENTION

Printed circuit board assemblies are used in computers, communications equipment, televisions, and many other products. In a typical printed circuit board assembly, many electrical components are attached to the top and bottom surfaces of a printed circuit board (PCB). Since the electronics manufacturing industry is highly competitive, it is important to maximize the through-put of processing PCB assemblies and to securely attach the electrical components to the PCBs.

The manufacturing of PCB assemblies involves many processes, one of which is surface mounting components to PCBs. To surface mount components to a first surface of a PCB, a dispenser deposits solder pads and/or adhesive pads onto the first surface of the PCB, and then a pick-and-place machine presses the components against the solder/adhesive pads. After the first side of the PCB has been populated with components, the PCB is inverted and the process is repeated to surface mount components to the second side of the PCB. The solder/adhesive dispenser is typically a stenciling machine, and the pick-and-place machine is typically a turret-type device.

Manufacturing issues related to supporting the populated sides of PCB assemblies are best understood in light of the structure and operation of conventional stencil printing machines. Conventional stenciling machines generally have a stencil plate, a movable platform under the stencil plate, and a PCB holder attached to the platform. Conventional stenciling machines also have two spaced-apart, parallel conveyor tracks to transport the PCB along a conveyor line between the stencil plate and the movable platform. In operation, the conveyor tracks engage opposing edges of the PCB and transport the PCB until it is over the PCB holder. The moveable platform then moves upwardly and engages the PCB holder with the downwardly facing side of the PCB to lift the PCB to the stencil plate. A wiper then moves across the stencil plate to press the solder paste or the adhesive compound onto the PCB. After the wiper stops, the work platform moves downwardly from the stencil plate to replace the PCB on the conveyor rails so that it can be transported to a pick-and-place machine.

In addition to maximizing the through-put of processing PCB assemblies, it is also becoming important to accurately mount a large number (e.g., 1000–1500) of very small components to one side of the PCB assemblies. An important aspect of surface mounting processes, therefore, is to accurately deposit very small solder pads and adhesive pads at precise locations on the PCB. Another important objective of surface mounting processes is to accurately press the electrical components onto the pads at the precise locations so that the electrical terminals of the components engage the desired solder pads. The PCB holders must accordingly hold the PCB assemblies flat with respect to the stencil plate so that a desired volume of the solder/adhesive compound is deposited in each pad across the surface of the PCB. Similarly, the PCB holders must hold the PCB assemblies flat in pick-and-place machines so that the terminals of the components engage the desired contacts on the surface of the PCB. Thus, it is generally desirable to uniformly support the underside of the PCB so that it does not bow or dip.

To uniformly support the underside of PCBs, one type of a conventional PCB holder has a platform and a number of pins removably attached to the platform to engage open areas or components on the underside of a PCB assembly. The pins of this type of a conventional PCB holder generally have a fixed height, and thus to engage a specific component, a pin having the correct height to support the specific component must be mounted to the platform at a location corresponding to that of the specific component. Another type of conventional PCB holder may have a platform, sidewalls projecting up from the platform to support the perimeter of a PCB, and spacers positioned within the sidewalls to support interior portions of the PCB. It will be appreciated that the pins and the spacers of conventional PCB holders generally prevent the PCBs from bowing to hold the PCBs flat for surface mounting processing.

Conventional PCB holders, however, encounter several manufacturing issues when components are surface mounted to both surfaces of a PCB assembly. For example, one problem with conventional PCB holders is that the pins or spacers may not be at the appropriate height or location to uniformly support the populated side of the PCB. The pins and spacers of conventional PCB holders are configured manually to engage vacant areas or to have a height that accommodates the components on the populated side of the PCB. However, it is extremely time-consuming to manually configure the individual supports on the platform to engage the vacant areas on a PCB. Moreover, it is even more difficult to select and position pins with the appropriate heights to engage components on the populated side of the PCB. Conventional PCB holders, therefore, may not uniformly support the PCB assemblies during surface mounting processes.

Conventional PCB holders are particularly difficult to operate efficiently in the manufacturing of contract PCB assemblies in which multiple runs of different PCB assemblies with different configurations of components are processed in a short period of time. Unlike dedicated PCB assembly manufacturing in which a large number of identical PCB assemblies are manufactured in each run, the down-time associated with configuring PCB holders in contract PCB manufacturing may significantly increase the cost of manufacturing the PCB assemblies. Therefore, there is a significant need to quickly and consistently support PCB assemblies with different configurations of components in the manufacturing of contract PCB assemblies.

SUMMARY OF THE INVENTION

The present invention is a universal fixture for holding PCB assemblies during stencil printing, pick-and-place mounting, and other manufacturing processes of PCB assemblies. In one embodiment, a universal PCB holder has a base and a plurality of support members movably attached to the base. The support members generally project away from the base along support paths, and the support members can move along the support paths when the support members engage a side of a PCB assembly. In operation, a PCB assembly is pressed against the support members to adjust the height of the support members so that they conform to the topography of the side of the PCB assembly. The PCB holder, therefore, may be quickly configured to uniformly support the populated sides of different PCB assemblies with different configurations of components.

In another embodiment, a PCB holder has a substructure with a first surface, a second surface, and a plurality of guide tracks extending with respect to the substructure along support paths. A plurality of support members are individually coupled to the guide tracks so that each support member may be moved along a corresponding guide track to project away from the first surface by an adjustable height, and a biasing element is operatively engaged with the support members to individually bias the support members along the guide tracks. The universal PCB holder may also have a locking mechanism operatively engageable with the biasing element and/or the support members to hold the support members in a desired configuration in which the support members conform to the topography of the populated side of the PCB.

In one specific embodiment, the substructure is a base plate and the guide tracks are holes extending through at least a portion of the base plate. The holes are typically configured in a pattern, such as a grid, to uniformly space the support members apart from one another. In this embodiment, the biasing element may comprise a plurality of springs in which a spring is positioned in each hole, and the support members may comprise a plurality of pins in which a pin is positioned on top of a corresponding spring in each hole. To position the pins in a desired configuration, a setup board identical to a PCB assembly is pressed against the pins to move the pins against the springs. Thus, once the PCB assembly is at a desired location, the pins are at appropriate heights to uniformly support the bottom side of the setup board. The pins are then locked into position with the locking mechanism to support all of the PCB assemblies with the configuration of the setup board.

DETAILED DESCRIPTION OF THE INVENTION

The present invention relates to universal PCB holders for supporting PCB assemblies. An aspect of one embodiment of the invention is to provide a plurality of pins that are slidably attached to a base so that the pins conform to the topography of a populated side of a PCB assembly by pressing the PCB assembly against the pins. Accordingly, an embodiment of a universal PCB holder may be quickly configured and reconfigured to uniformly support different PCB assemblies with different configurations of components. FIGS. 1A–5, in which like reference numbers refer to like parts, illustrate various embodiments of universal PCB holders in accordance with the invention.

Figure 1A:
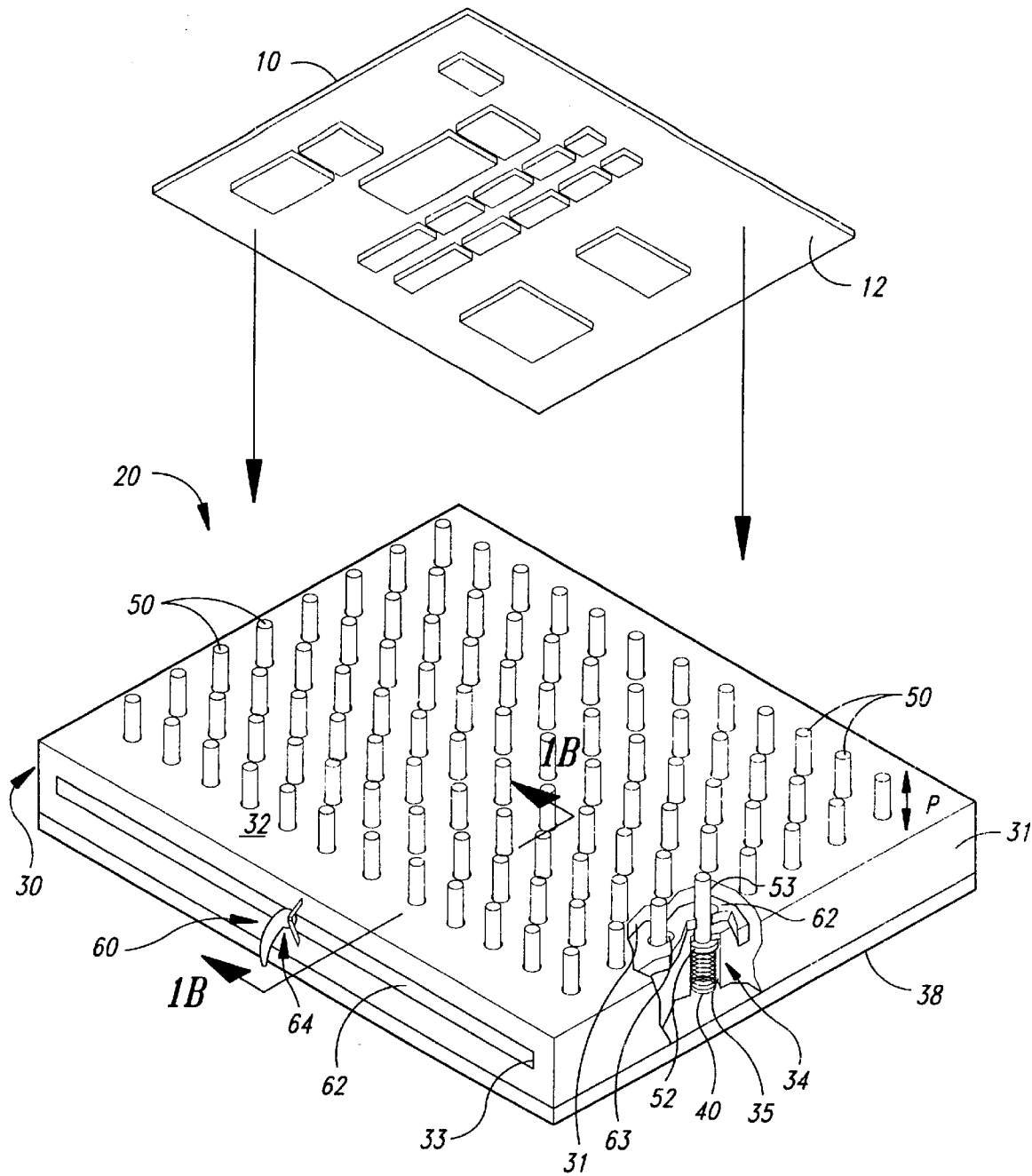
FIG. 1A is a schematic isometric view of an embodiment of a universal PCB holder in accordance with the invention.
Figure 1B:
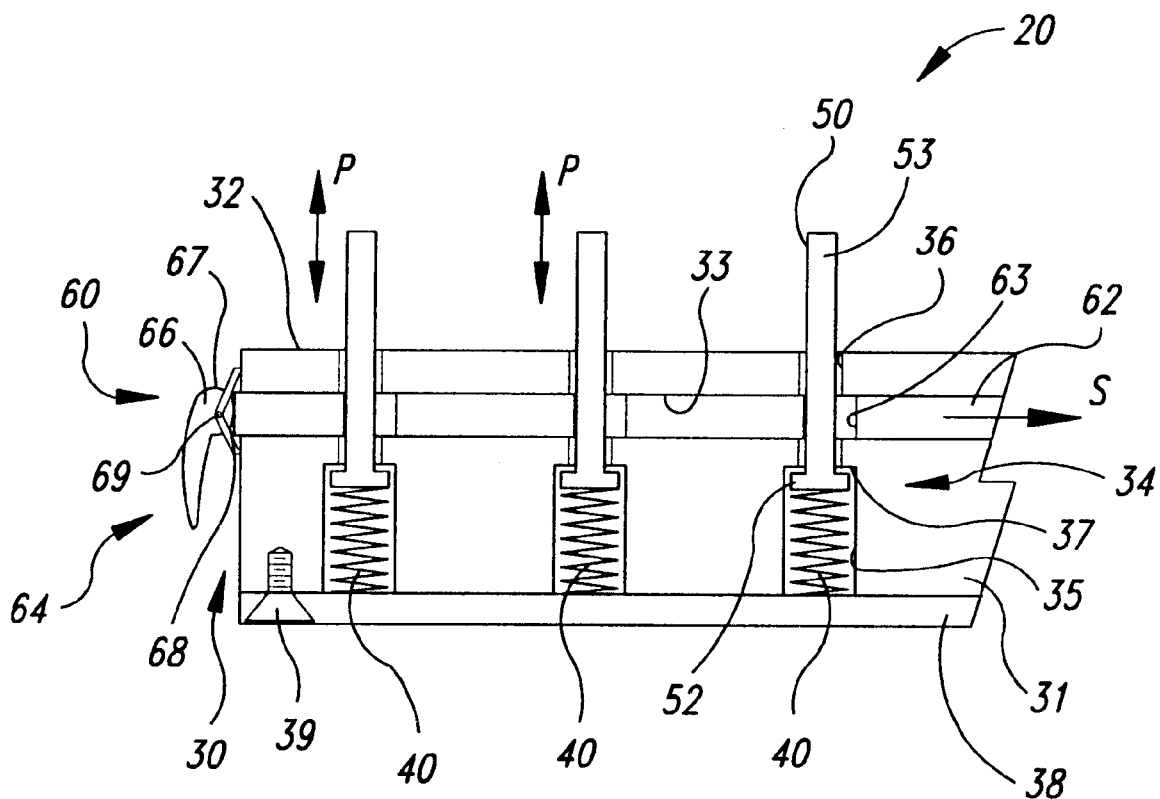
FIG. 1B is a partial cross-sectional view of the embodiment of the universal PCB holder of FIG. 1 taken along line 1B—1B.

FIG. 1A is a schematic isometric view of an embodiment of a universal PCB assembly holder 20, and FIG. 1B is a partial cross-sectional view of the universal PCB assembly holder 20 along line 1B—1B. The holder 20 may have a base 30 and a plurality of support members 50 slidably attached to the base 30 to move along individual support paths P. In one embodiment, the base 30 is a substructure or fixture that has a body 31 with a top surface 32, a slot 33 at an intermediate level within the body 31, and a plurality of holes 34 through at least part of the body 31. The holes 34 define guide tracks that guide the support members 50 along the support paths P, but the guide tracks may be posts (not shown) or other types of devices that project from top surface 32. As best shown in FIG. 1B, the holes 34 may have a lower section 35 below the slot 33 and an upper section 36 extending from the lower section 35 to the top surface 32 of the body 31. The upper section 36 may have a smaller diameter or other cross-sectional shape than the lower section 35 to define a stop surface 37 at an intermediate level within the body 31. To close the lower sections 35 of the holes 34, a bottom plate 38 may be attached to the body 31 with screws 39 (only one shown in FIG. 1B) or other types of fasteners.

The support members 50 are positioned in the base 30 to project upwardly from the top surface 32 of the body 31. Each support member 50 is moveably coupled to a corresponding guide track to project away from the top surface 32 by an adjustable distance. As shown in FIGS. 1A and 1B, for example, the support members 50 may be pins with a foot 52 positioned in the lower section 35 of each hole 34 and an elongated segment 53 positioned through the upper section 36 to project beyond the top surface 32 of the body 31. The support members 50, however, may be posts, rods or other devices that can slide along a guide track and support a PCB assembly.

The support members 50 may be biased upwardly by a plurality of biasing elements such as springs 40 positioned in the lower sections 35 of the holes 34. As best shown in FIG. 1B, the springs 40 may bias the support members 50 upwardly until the foot 52 of each support member 50 engages a corresponding stop surface 37. The springs 40 accordingly individually bias the support members 50 along the support paths P so that the support members 50 may move independently as a populated side 12 of a PCB assembly 10 is pressed against the support members 50. As a result, the height of the support members 50 may be quickly adjusted to correspond to the topography of the populated side 12 of the PCB assembly 10.

The embodiment of the universal holder 20 illustrated in FIGS. 1A and 1B may also have a locking mechanism 60 to hold the support members 50 after they are positioned to conform to the topography of the populated side 12 of the PCB 10. The locking mechanism 60 may have a lock-plate 62 positioned in the slot 33 of the base to slide transversely (indicated by arrow S) with respect to the support members 50. The lock-plate 62 preferably has a plurality of holes or slots 63 (best shown in the cut-out portion of FIG. 1A) configured in a pattern corresponding to the holes 34 in the base 30. Accordingly, the elongated segment 53 of each support member 50 passes through a hole or slot 63 in the lock-plate 62. The locking mechanism 60 may also have an actuator 64 with a bracket 68 attached to the body 31 at either side of the slot 33, and a cam-lever 66 pivotally attached to the bracket 68 with a pin 69.

In the operation of the embodiment of the locking mechanism 60 shown in FIGS. 1A and 1B, the cam-lever 66 rotates about the pin 69 (indicated by arrow R) and engages a cam lobe 67 with the lock-plate 62 to drive the lock-plate 62 through the slot 33. As the lock-plate 62 moves through the slot 33, the edge of each hole 63 pushes the elongated segment 53 of a corresponding support member 50 against the body 31 to frictionally hold the support member 50 at a desired height. The support members 50 may be released by rotating the cam-lever 66 in the opposite direction and pushing the lock-plate 62 back against the cam lobe 67 to align the holes 63 with the support members 50. The lock-plate 62 may be pushed back by another cam-lever (not shown) on the opposite side of the body 31.

Figure 2:
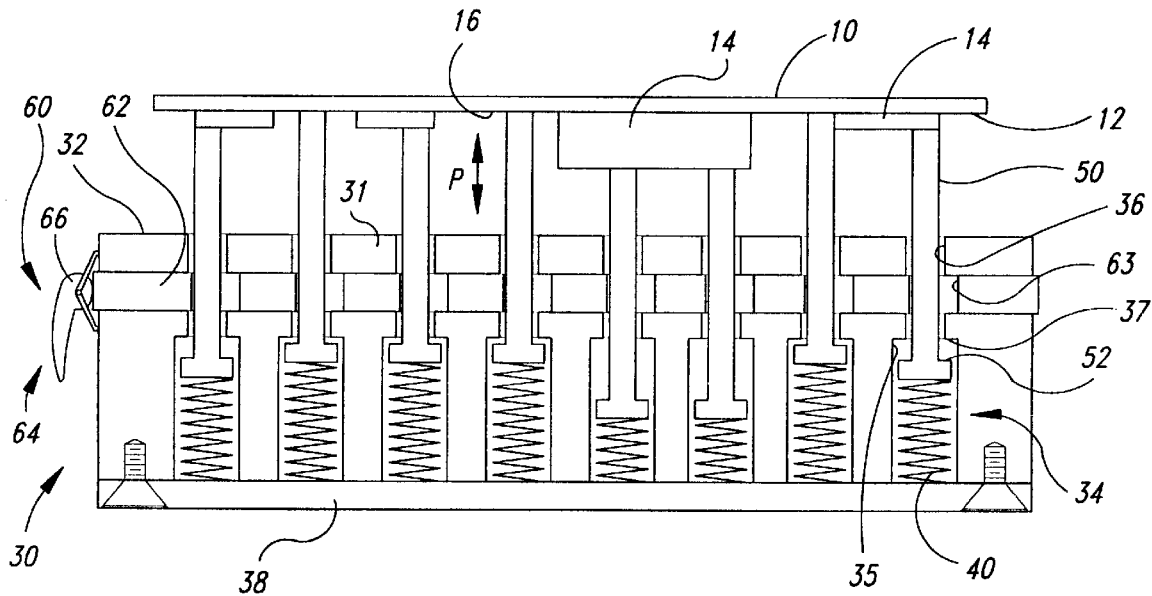
FIG. 2 is a cross-sectional view of the embodiment of the universal PCB of FIG. 1 taken, in part, along line 1B—1B supporting a populated side of a PCB assembly.

FIG. 2 is a cross-sectional view the embodiment of the universal PCB holder 20 of FIGS. 1A and 1B shown supporting the populated side 12 of the PCB assembly 10. The populated side 12 my have a plurality of components 14 and vacant areas 16 that define the topography of the populated side 12. In operation, the populated side 12 of the PCB assembly 10 is pressed against the support members 50 until the PCB assembly 10 is at a desired position with respect to the base 30. The components 14 and vacant areas 16 accordingly drive the support members 50 downwardly along the support paths P against the springs 40. The support members 50, therefore, "self-adjust" to support the components 14 and the vacant areas 16. Once the PCB assembly 10 is positioned at the desired elevation with respect to the base 30, the cam-lever 66 of the actuator 64 is rotated to lock the support members 50 in a configuration that conforms to the topography of the components 14 and the vacant areas 16. The other side of the PCB assembly 10 may then be processed in a stenciling machine, pick-and place machine, or other type of PCB assembly processing machine.

The universal holder 20 may be configured and reconfigured to securely support many different PCB assemblies with different configurations of components. For example, the support members 50 may remain locked in a single configuration to uniformly support one run of PCB assemblies that have the same configuration of components. After the run of PCB assemblies is finished, the locking mechanism 60 may be released to disengage the support members 50 and allow the springs 40 to drive the support members 50 upwardly until the foot 52 of each support member 50 engages a corresponding stop surface 37. The universal holder 20 may then be re-configured to support another run of PCB assemblies with a different configuration of components by simply pressing the populated side of one of the different PCB assemblies against the support members. Additionally, the support members 50 may remain locked in position to uniformly support the run of different PCB assemblies by actuating the locking mechanism to lock the support members in the positions where they conform to the topography of the populated sides of the different PCB assemblies.

An advantage of an embodiment of the holder 20 is that it uniformly supports a side of a PCB assembly. Unlike conventional holders that position pins or spacers under vacant areas or other convenient locations of a PCB assembly, an embodiment of the holder 20 provides a uniform pattern of support members 50 to evenly support the populated side of a PCB assembly. The holder 20, therefore, may be particularly useful in supporting large PCB assemblies that may tip or wobble unless all of the support members are accurately positioned and adjusted to be at an appropriate height.

Another advantage of an embodiment of the holder 20 is that it may be quickly configured to uniformly support the populated sides of PCB assemblies with different configurations of components. Unlike conventional holders in which the supports are positioned manually and the heights of the supports are adjusted manually, the embodiment of the PCB holder 20 illustrated in FIGS. 1A–2 may be quickly configured to support many different PCB assemblies with different configurations of components. Accordingly, an embodiment of the PCB holder 20 may reduce the downtime to configure an assembly line to manufacture different PCB assemblies with different configurations of components.

Figure 3:
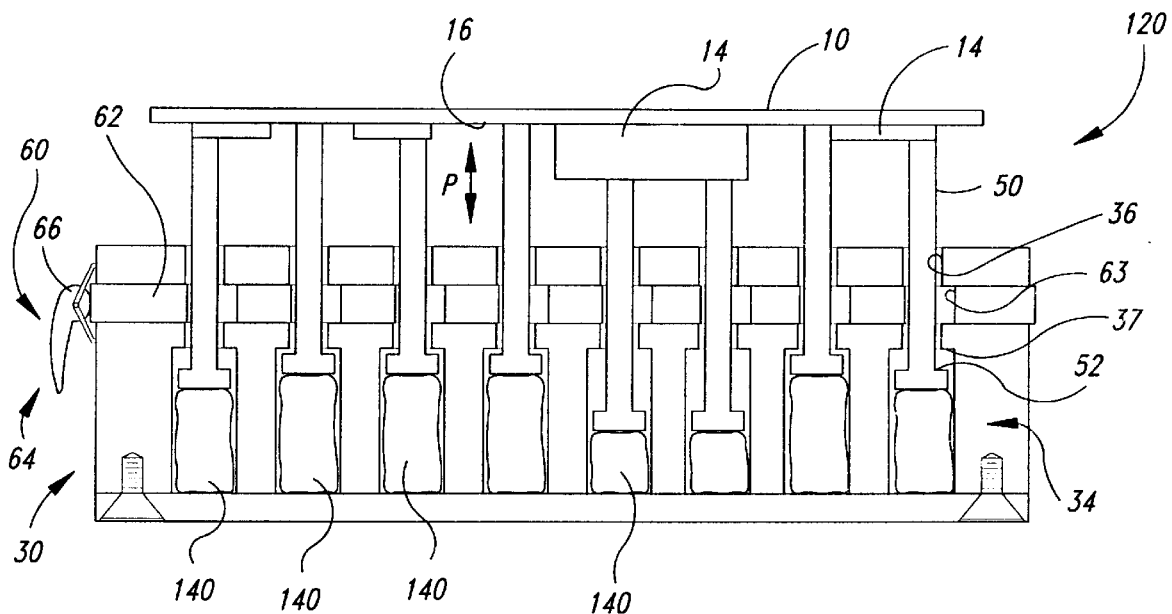
FIG. 3 is a cross-sectional view of another embodiment of a universal PCB holder in accordance with the invention.

FIG. 3 is a cross-sectional view of an embodiment of another universal PCB holder 120 in which a number of cushions or inflatable bladders 140 are positioned in the lower portion 35 of each hole 34. The cushions or bladders 140 define a biasing element that operates similar to the springs 40 described above in FIGS. 1A–2. Additionally, the embodiment of the holder 120 illustrated in FIG. 3 operates in the same manner and generally has the same advantages as the embodiment of the holder 20 described above in FIGS. 1A–2.

Figure 4:
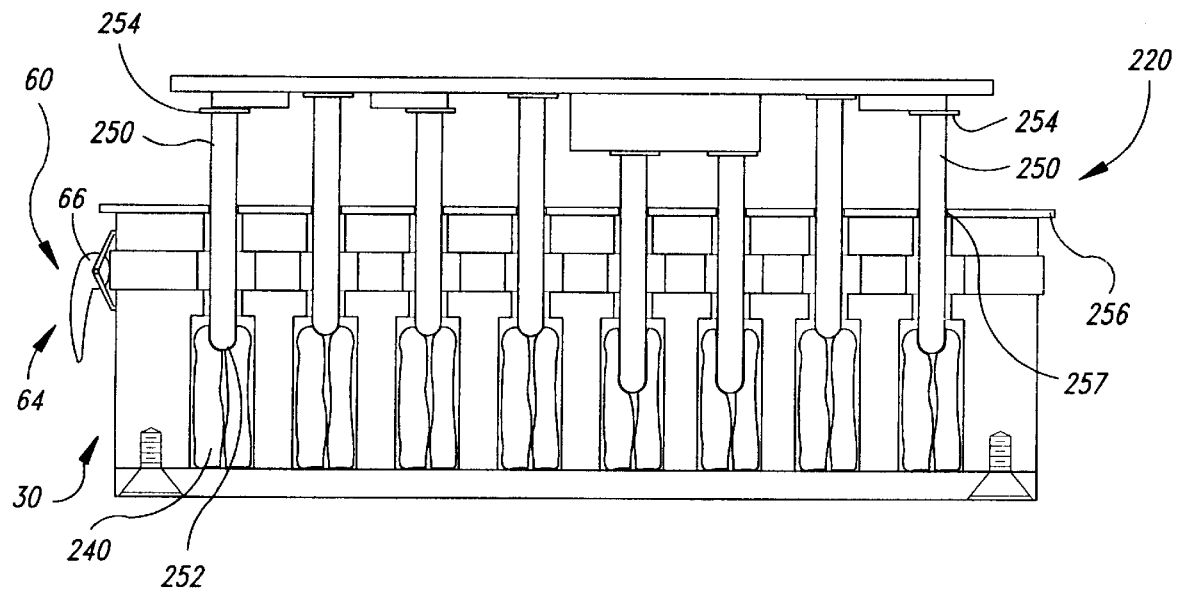
FIG. 4 is a cross-sectional view of another embodiment of a universal PCB holder in accordance with the invention.

FIG. 4 is a cross-sectional view of another embodiment of a universal PCB holder 220 that has a base 30 and a locking mechanism 60 (as described above with respect to FIGS. 1A–2). The holder 220, however, has support members 250 with a lower end 252 received in a friction element 240 and an upper end head 254 positioned above the base 30. The upper end 254 may be a head that is wider than the support member 250. The holder 220 also has a lift-plate 256 with a plurality of holes 257 corresponding to the position of the support members 250 so that each support member 250 passes through a hole 257. In operation, the PCB assembly 10 is pressed against the upper ends 254 of the support members 250 to drive the lower ends 252 of the support members 250 into the friction elements 240. The friction elements 240 prevent the support members 250 from falling into the holes 36, and thus the friction elements 240 define a biasing element that is operatively engaged with the support members 250. The support members 50 may be locked into position with the locking mechanism 60, and then the support members 50 may be reconfigured by releasing the locking mechanism 60 and raising the lift-plate 256 until it engages the upper ends 254 and moves the support members 250 into a raised position. Another PCB assembly with a different configuration of components may then be pressed against the support members 250 to reconfigure the support members 250, as described above.

Figure 5:
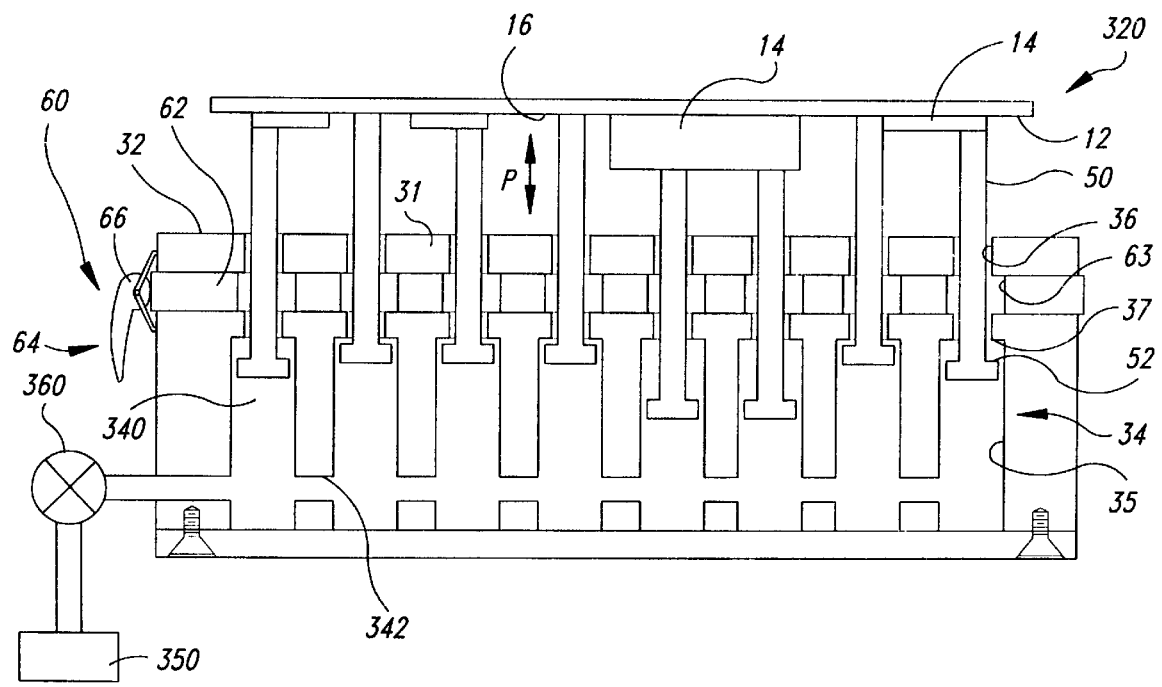
FIG. 5 is a cross-sectional view of another embodiment of a universal PCB holder in accordance with the invention.

FIG. 5 is a cross-sectional view of yet another embodiment of a universal PCB holder 320 in which the support members 50 are supported with a fluid 340. In this embodiment, a pump 350 pumps a fluid 340 through a valve 360 and into the lower portion 35 of each hole 34. To provide a substantially uniform fluid pressure in the holes 34, the holes 34 are commonly connected to be in fluid communication with one another by a number of fluid passageways 342 between the holes 34. The pressure of the fluid 340 is typically low so that the fluid 340 defines a biasing element that allows the populated side 12 of the PCB assembly 10 to drive the support members 50 downwardly into the holes 34. Once the support members 50 are in a desired configuration, the valve 60 is closed to prevent the support members 50 from moving in the holes 34. In one embodiment, the fluid 340 is substantially incompressible so that the fluid 340 and the valve 360 define a locking mechanism that holds the support members 50 in a configuration that conforms to the topography of the populated side 12 of the PCB 10.

From the foregoing it will be appreciated that, although specific embodiments of the invention have been described herein for purposes of illustration, various modifications may be made without deviating from the spirit and scope of the invention. For example, the base 30 may have configurations other than the embodiments of the base 30 shown in FIGS. 1A–5. In alternate embodiments (not shown), the base 30 may not have a slot 33, or the holes 34 may be drilled down from the top surface 32 to have a substantially constant diameter within the body 31. Additionally, the pattern of the holes 34 in the base may be different to support different shapes of PCB assemblies. Accordingly, the invention is not limited except as by the appended claims.

We claim:

1. A universal tool for holding printed circuit board assemblies populated with components, comprising:

a base;

a plurality of support members moveably attached to the base to project away from the base along support paths, at least some of the support members being independently positionable along the support paths when the support members engage a side of a printed circuit board assembly to selectively configure the support members at heights corresponding to a topography of the side of the printed circuit board assembly; and a locking mechanism operatively engageable with at least one of the biasing element and the support members to fix the height of each support member when the mechanism is engaged.

2. The tool of claim 1 wherein:

the base comprises a top surface and a plurality of guide tracks extending with respect to the base along the support paths; and each support member is operatively coupled to a corresponding guide track to move along the guide track and project away from the top surface of the base by an adjustable distance.

3. The tool of claim 2 wherein the guide tracks comprise holes in the base and the support members are pins moveably positioned in the holes.

4. The tool of claim 2 wherein the base further comprises a biasing element operatively engaged with the support members to independently bias the support members when the support members engage the populated side of the printed circuit board assembly.

5. The tool of claim 2 wherein:

the guide tracks comprise a plurality of holes in the base;

the support members comprise a plurality of pins, each pin being positioned in a corresponding hole; and the base further comprises a biasing element operatively engaged with the pins to independently bias the pins when the pins engage the populated side of the printed circuit board assembly.

6. The tool of claim 5 wherein the biasing element comprises a plurality of springs, each spring being positioned under a corresponding pin in a hole.

7. The tool of claim 5 wherein the biasing element comprises a plurality of compressible, resilient pads, each pad being positioned under a corresponding pin in a hole.

8. The tool of claim 5 wherein the biasing element comprises a plurality of bladders filled with a compressible fluid, each bladder being positioned under a corresponding pin in a hole.

9. The tool of claim 5 wherein the holes are in fluid communication with one another and the biasing element comprises a pressurized fluid in the holes.

10. The tool of claim 1 wherein:

the base comprises a body with a top surface, a plurality of holes in the body along the support paths, and a slot at an intermediate depth within the body extending transversely with respect to the holes;

the support members comprise a plurality of pins, each pin being positioned in a corresponding hole; and the locking mechanism comprises a lock-plate positioned in the slot and an actuator attached to the body, the lock-plate having a plurality of holes corresponding to the holes in the body so that the pins pass through the lock-plate, and the actuator driving the lock-plate transversely with respect to the pins to frictionally lock the pins to the body in a locked position.

11. The tool of claim 10 wherein the base further comprises a biasing element operatively engaged with the support members to individually bias the support members when the support members engage the populated side of the printed circuit board assembly and the locking mechanism is in a released position in which the holes in the lock-plate allow the pins to move along the support paths.

12. The tool of claim 1 wherein all of the support members are independently positionable along the support paths.

13. A universal fixture for holding printed circuit board assemblies populated with components, comprising:

a substructure;

a plurality of pins projecting away from the substructure, each pin being slidable along a path with respect to the substructure to be selectively positioned at a desired height so that the plurality of pins conforms to a topography of a side of a printed circuit board assembly; and a locking mechanism operatively engageable with at least one of the biasing element and the pins to fix the pins against moving along the support paths.

14. The fixture of claim 13 wherein:

the substructure comprises a top surface and a plurality of guide tracks extending with respect to the substructure along the support paths; and each pin is operatively coupled to a corresponding guide track to move along the guide track and project away from the top surface of the substructure by an adjustable distance.

15. The fixture of claim 14 wherein the guide tracks comprise holes in the substructure and the pins are moveably positioned in the holes.

16. The fixture of claim 14 wherein the substructure further comprises a biasing element operatively engaged with the pins to individually bias the pins when the pins engage the populated side of the printed circuit board assembly.

17. The fixture of claim 14 wherein:

the guide tracks comprise a plurality of holes in the substructure;

each pin is positioned in a corresponding hole; and the substructure further comprises a biasing element operatively engaged with the pins to individually bias the pins when the pins engage the populated side of the printed circuit board assembly.

18. A universal fixture for holding printed circuit board assemblies populated with components, comprising:

a substructure;

a plurality of pins slideably attached to the substructure to move along support paths while engaged with points on a side of a printed circuit board assembly, each pin being selectively positionable at a height relative to the substructure to support a corresponding point on the side of the printed circuit board assembly; and a locking mechanism operatively engageable with at least one of the biasing element and the pins to fix the pins relative to the substructure.

19. The fixture of claim 18 wherein:
the substructure comprises a top surface and a plurality of guide tracks extending with respect to the substructure along the support paths; and
each pin is operatively coupled to a corresponding guide track to move along the guide track and project away from the top surface of the substructure by an adjustable distance.

20. The fixture of claim 19 wherein the guide tracks comprise holes in the substructure and the pins are moveably positioned in the holes.

21. The fixture of claim 19 wherein:
the guide tracks comprise a plurality of holes in the substructure;
each pin is positioned in a corresponding hole; and
the substructure further comprises a biasing element operatively engaged with the pins to individually bias the pins when the pins engage the populated side of the printed circuit board assembly.

22. The fixture of claim 18 wherein the substructure further comprises a biasing element operatively engaged with the pins to individually bias the pins when the pins engage the populated side of the printed circuit board assembly.

23. The fixture of claim 18 wherein:
the substructure comprises a body with a top surface, a plurality of holes in the body along the support paths, and a slot at an intermediate depth within the body extending transversely with respect to the holes;
each pin is positioned in a corresponding hole; and
the locking mechanism comprises a lock-plate positioned in the slot and an actuator attached to the body, the lock-plate having a plurality of holes corresponding to the holes in the body so that the pins pass through the lock-plate, and the actuator driving the lock-plate transversely with respect to the pins to frictionally lock the pins to the body in a locked position.

24. A universal holder for supporting printed circuit board assemblies, comprising:
a substructure having a first surface, a second surface, and a plurality of guide tracks extending with respect to the substructure at least substantially parallel to a support axis;
a plurality of support members, each support member being individually coupled to a corresponding guide track to be moveable along the corresponding guide track and project away from the first surface by an adjustable distance; and
a biasing element operatively engaged with the support members to individually bias the support members when the support members engage a populated side of a printed circuit board assembly so that the support members conform to a contour of the populated side of the printed circuit board; and
a locking mechanism operatively engageable with at least one of the biasing element and the support members to hold the support members in positions where the support members conform to the topogaphy of the populated side of the printed circuit board.

25. The holder of claim 24 wherein:
the guide tracks comprise a plurality of holes in the substructure; and
the support members comprise a plurality of pins, each pin being positioned in a corresponding hole.

26. The holder of claim 25 wherein the biasing element comprises a plurality of springs, each spring being positioned under a corresponding pin in a hole.

27. The holder of claim 25 wherein the biasing element comprises a plurality of compressible, resilient pads, each pad being positioned under a corresponding pin in a hole.

28. The holder of claim 25 wherein the biasing element comprises a plurality of bladders filled with a compressible fluid, each bladder being positioned under a corresponding pin in a hole.

29. The holder of claim 24 wherein:
the substructure comprises a body with a slot at an intermediate depth extending transversely with respect to the guide tracks;
the guide tracks comprise holes in the body;
the support members comprise a plurality of pins, each pin being positioned in a corresponding hole; and
the locking mechanism comprises a lock-plate positioned in the slot and an actuator attached to the body, the lock-plate having a plurality of holes corresponding to the holes in the body so that the pins pass through the lock-plate, and the actuator driving the lock-plate transversely with respect to the pins to frictionally lock the pins to the body in a locked position.

30. The holder of claim 29 wherein the biasing element comprises a plurality of springs, each spring being positioned under a corresponding pin in a hole.

31. The holder of claim 29 wherein the biasing element comprises a plurality of compressible, resilient pads, each pad being positioned under a corresponding pin in a hole.

32. The holder of claim 29 wherein the biasing element comprises a plurality of bladders filled with a compressible fluid, each bladder being positioned under a corresponding pin in a hole.

33. A universal printed circuit board holder for supporting printed circuit board assemblies, comprising:
a fixture having a first surface, a second surface, and a plurality of holes, the holes being open at the first surface and extending into the fixture;
a plurality of support members positioned in the holes, the support members being individually moveable within the holes to project away from the first surface by variable distances along support paths;
a biasing element operatively engaged with the support members, the biasing element individually biasing the support members along the support paths while the support members engage points on a side of the printed circuit board assembly to selectively position the support members in a configuration corresponding to a topography of the side of the printed circuit board assembly; and
a locking mechanism operatively engageable with at least one of the biasing element and the support members to hold the support members in positions where the support members conform to the topography of the populated side of the printed circuit board.

34. The holder of claim 33 wherein the support members comprise a plurality of pins, each pin being positioned in a corresponding hole in the fixture.

35. The holder of claim 34 wherein the biasing element comprises a plurality of springs, each spring being positioned under a corresponding pin in a hole.

36. The holder of claim 24 wherein the biasing element comprises a plurality of compressible, resilient pads, each pad being positioned under a corresponding pin in a hole.

37. The holder of claim 24 wherein the biasing element comprises a plurality of bladders filled with a compressible fluid, each bladder being positioned under a corresponding pin in a hole.

38. The holder of claim 33 wherein:

the fixture comprises a body with a slot at an intermediate depth extending transversely with respect to the guide tracks;

the support members comprise a plurality of pins, each pin being positioned in a corresponding hole; and the locking mechanism comprises a lock-plate positioned in the slot and an actuator attached to the body, the lock-plate having a plurality of holes corresponding to the holes in the fixture so that the pins pass through the lock-plate, and the actuator driving the lock-plate transversely with respect to the pins to frictionally lock the pins to the body in a locked position.

39. The holder of claim 38 wherein the biasing element comprises a plurality of springs, each spring being positioned under a corresponding pin in a hole.

40. The holder of claim 38 wherein the biasing element comprises a plurality of compressible, resilient pads, each pad being positioned under a corresponding pin in a hole.

41. A universal holder for supporting printed circuit board assemblies, comprising:

a substructure having a first surface, a second surface, and a plurality of guide tracks extending with respect to the substructure at least substantially parallel to a support axis;

a plurality of support members, each support member being individually coupled to a corresponding guide track to be moveable along the corresponding guide track and project away from the first surface by an adjustable distance;

a biasing element operatively engaged with the support members to individually bias the support members when the support members engage a populated side of a printed circuit board assembly so that the support members conform to a contour of the populated side of the printed circuit board; and a locking mechanism operatively engageable with at least one of the biasing elements and the support members, wherein the engagement of the locking mechanism with at least one of the biasing elements and the support members fixes the support members at selected heights relative to the first surface of the substrate.

* * * * *

UNITED STATES PATENT AND TRADEMARK OFFICE
CERTIFICATE OF CORRECTION

PATENT NO. : 5,984,293
DATED : November 16, 1999
INVENTOR(S) : Steve Abrahamson and Curtis C. Thompson, Sr.

It is certified that error appears in the above-identified patent and that said Letters Patent is hereby corrected as shown below:

Claim 21,
Line 1, "The fixture of claim 19 wherein:" should be -- The fixture of claim 18 wherein: --

Claim 22,
Line 1, "The fixture of claim 18 wherein the substructure" should be -- The fixture of claim 19 wherein the substructure --

Signed and Sealed this

Second Day of October, 2001

Attest:

NICHOLAS P. GODICI
*Attesting Officer*    *Acting Director of the United States Patent and Trademark Office*